United States Patent
Williams et al.

(10) Patent No.: US 9,209,810 B2
(45) Date of Patent: Dec. 8, 2015

(54) RATIOLESS NEAR-THRESHOLD LEVEL TRANSLATOR

(71) Applicants: Jacob T. Williams, Austin, TX (US); Jeffrey C. Cunningham, Austin, TX (US); Karthik Ramanan, Austin, TX (US)

(72) Inventors: Jacob T. Williams, Austin, TX (US); Jeffrey C. Cunningham, Austin, TX (US); Karthik Ramanan, Austin, TX (US)

(73) Assignee: FREESCALE SEMICONDUCTOR, INC., Austin, TX (US)

(*) Notice: Subject to any disclaimer, the term of this patent is extended or adjusted under 35 U.S.C. 154(b) by 73 days.

(21) Appl. No.: 14/253,930

(22) Filed: Apr. 16, 2014

(65) Prior Publication Data
US 2015/0303923 A1   Oct. 22, 2015

(51) Int. Cl.
*H03L 5/00* (2006.01)
*H03K 19/0185* (2006.01)

(52) U.S. Cl.
CPC .............................. *H03K 19/018528* (2013.01)

(58) Field of Classification Search
CPC ........................................................ H03L 5/00
USPC .................... 327/306, 333; 326/61–62, 80–81
See application file for complete search history.

(56) References Cited

U.S. PATENT DOCUMENTS

| | | | |
|---|---|---|---|
| 5,650,742 A | 7/1997 | Hirano | |
| 5,912,577 A | 6/1999 | Takagi | |
| 6,005,432 A | 12/1999 | Guo et al. | |
| 6,265,896 B1 | 7/2001 | Podlesny et al. | |
| 7,009,424 B2 | 3/2006 | Khan et al. | |
| 7,145,364 B2 * | 12/2006 | Bhattacharya et al. | 326/68 |
| 7,671,629 B2 | 3/2010 | Zhang et al. | |
| 7,777,522 B2 | 8/2010 | Yang et al. | |
| 8,350,592 B1 | 1/2013 | Malhan et al. | |
| 8,378,728 B1 | 2/2013 | Goyal et al. | |
| 8,427,223 B2 * | 4/2013 | Kumar et al. | 327/333 |
| 8,432,189 B1 | 4/2013 | Malhan et al. | |

OTHER PUBLICATIONS

Kulkarni, S. et al., "High Performance Level Conversion for Dual VDD Design", IEEE Transactions on Very Large Scale Integration (VLSI) Systems, vol. 12, No. 9, Sep. 2004, pp. 926-936.

* cited by examiner

*Primary Examiner* — Dinh Le (57) ABSTRACT

An output circuit, between a first power supply terminal and a second power supply terminal, receives a first logic signal that switches between a first logic state based on a voltage at the first power supply terminal and a second logic state based on a voltage at the second power supply terminal and provides a second logic signal, complementary to the first logic signal. A level translator is in a second power supply domain configured to have a second voltage differential between a third power supply terminal and a fourth power supply terminal, wherein the second voltage differential is greater than the first voltage differential. The level translator is designed so that it may be implemented using a subset of the transistors that have the shortest channel length and narrowest channel width.

20 Claims, 3 Drawing Sheets

RATIOLESS NEAR-THRESHOLD LEVEL TRANSLATOR

BACKGROUND

1. Field

This disclosure relates generally to level translators, and more specifically, to ratioless, near-threshold level translators.

2. Related Art

Level translators take advantage of different techniques to manage contentious internal nodes, particularly at levels near the thresholds of the constituent transistors. As electronic device continue to grow smaller, new techniques are required to manage these contentious nodes while also managing size, energy use, and other design issues.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Level translators may be used in a variety of configurations, system implementations, etc. One particular system implementation may involve translating signals from one level to another in a range near the thresholds of the translator's constituent transistors. For example, a level translator may be used to translate a source-biased input to an unbiased source on a different voltage domain.

Depending on the configuration, it may also be necessary and/or desirable to be able to translate levels for one or more aspects of a given input. For example, a level translator may be operable to translate two different voltage levels (e.g., a top rail voltage and a bottom rail voltage) associated with the same input. Depending on the configuration, however, the level translator may be operable to translate only one aspect, and/or only one aspect at any one time.

In order to manage contentious internal nodes (i.e., those nodes at which a plurality of components attempt to provide different electrical outcomes at the same node), level translators have implemented various techniques. One such technique is the use of transistors of differing sizes in order to ensure that the appropriate outcome is achieved. This technique may be referred to as implementing a particular "ratio" with respect to certain transistors. However, the use of larger transistors may have difficulties scaling when the manufacturing process scales. Further, designing such ratios may make it more difficult to account for variability among individual transistors. Still further, repeated operation of circuits implementing transistors of different sizes may, over time, result in changes to the individual transistors, thus altering the actual ratios and reducing performance.

One area in which these concerns may be of particular note is at an interface between logic domains in which the number of incoming signals is large, with each signal using a separate (or substantially separate) level translator. For example, in an interface between a digital processing block and an analog flash memory block, there may be about four hundred individual signal lines. An interface may be implemented such that each line uses a separate level translator. With such a large number of level translators, managing performance while accounting for variations in individual transistors and size considerations increases in difficulty.

Figure 1:
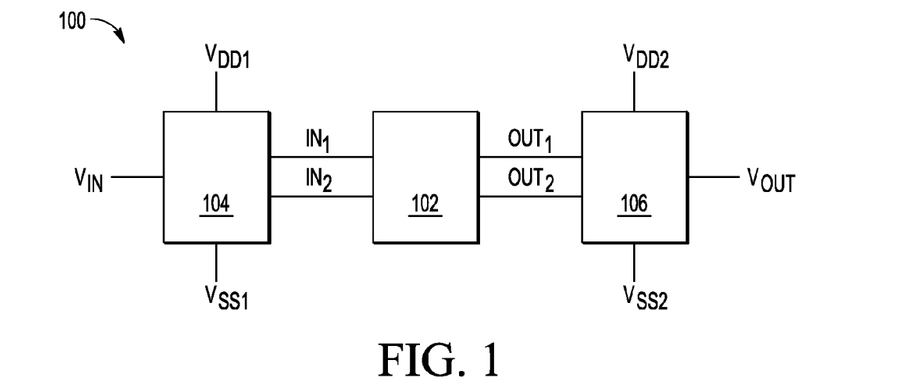
FIG. 1 illustrates a high-level block diagram of an example level translation system, in accordance with certain embodiments of the present disclosure.

FIG. 1 illustrates a high-level block diagram of an example level translation system 100, in accordance with certain embodiments of the present disclosure. System 100 may include level translator 102 electrically coupled to both input logic domain 104 and output logical domain 106. Level translator 102 may be any appropriate circuit, as described in more detail below with reference to FIGS. 2-4, operable to translate a chosen electrical properties (e.g., current, voltage, etc.) of input logic domain 104 to a corresponding electrical aspect of output logical domain 106. For example, level translator 102 may be operable to translate one or more voltage levels associated with input logic domain 104 to one or more different voltage levels associated with output logical domain 106.

In some embodiments, input logic domain 104 may be any appropriate system, device, circuit, logic, interface, or other combination of electrical components operable to provide a plurality of input signals (e.g., $IN_1$ and $IN_2$) to level translator 102, as described in more detail below with reference to FIGS. 2-4. For example, input logic domain 104 may be digital circuitry implementing some digital logic, responsive to an input signal (e.g., $V_{IN}$). This may include, for example, some or all of a processing array associated with a system on chip. In such an example, input logic domain 104 may operate with two voltage levels, each associated with a logic level. For example, $V_{DD1}$ may be associated with a logical "high" and $V_{SS1}$ may be associated with a logical "low." In some embodiments, the voltage levels associated with the logical levels of input logic domain 104 may vary depending on one or more operating modes of input logic domain 104. For example, the higher voltage may vary from 1-1.4 V, while the lower voltage may vary from 0-0.4 V.

In some embodiments, output logical domain 106 may be any appropriate system, device, circuit, logic, interface, or other combination of electrical components operable to receive a plurality of output signals (e.g., $OUT_1$ and $OUT_2$) from level translator 102, as described in more detail below with reference to FIGS. 2-4. For example, output logical domain 104 may be logic circuitry with an output signal (e.g., $V_{OUT}$). This may include, for example, an output driver for driving an input signal for a flash memory array. Output logic domain 106 may also have associated a plurality of logic levels, with a voltage associated with each logic level. For example, $V_{DD2}$ may be associated with a logical "high" and $V_{SS2}$ may be associated with a logical "low."

System 100 may be operable to translate one or more electrical properties (e.g., voltage) from one logical domain to another (e.g., from input logic domain 104 to output logical domain 106) so long as the difference between those properties is within an operational range of ratioless level translator 102. For example, level translator 102 may operate to translate $V_{DD1}$ to $V_{DD2}$ so long as the difference between $V_{DD1}$ and $V_{DD2}$ is less than the threshold voltage of the individual transistors comprising level translator 102.

In some embodiments, the electrical properties (e.g., voltage) associated with the same logic levels of different logic domains may be the same, substantially the same, or different. In the same or alternative embodiments, the property associated with one logic level might be the same (or substantially the same) while the property associated with another logic level might be different. For example, level translator 102 may be operable to translate only the voltage levels associated with a logical "high," only the voltage levels associated with a logical "low," and/or both voltage levels in parallel.

As described in more detail below with reference to FIGS. 2-4, system 100 may be configured such that these translations may be made using minimum-size transistors within level translator 102.

Figure 2:
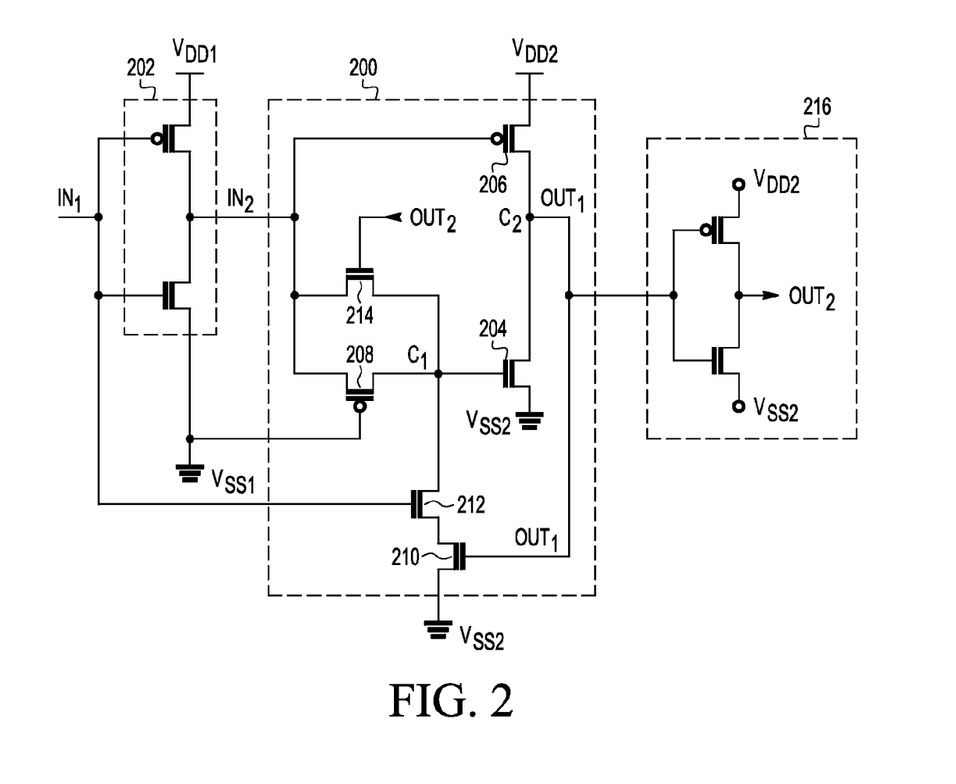
FIG. 2 illustrates an example lower voltage translator, in accordance with certain embodiments of the present disclosure.

FIG. 2 illustrates an example lower voltage translator 200, in accordance with certain embodiments of the present disclosure. Translator 200 may be electrically coupled to input circuitry 202 and output circuitry 216, and operable to translate a first lower voltage associated with input circuitry 202 (e.g., $V_{SS1}$) into a second lower voltage associated with output circuitry 216 (e.g., $V_{SS2}$). Although two upper voltages are shown (e.g., $V_{DD1}$ and $V_{DD2}$) for the purposes of translator 200, they may be considered equal. In some embodiments, input circuitry 202 may generally correspond to a portion of input logic domain 104, while output circuitry 216 may generally correspond to a portion of output logic domain 106.

In some embodiments, input circuitry 202 may be an inverting circuit providing two input signals (e.g., $IN_1$ and $IN_2$) to a level translator. These signals may be logical inverses of one another. In the illustrated example, input circuitry 202 may include an n-type transistor electrically coupled to a p-type transistor.

In some embodiments, translator 200 may include a plurality of n-type and p-type transistors. For ease of description, these transistors may be referred to as "NFETs" and "PFETs," respectively, although one of ordinary skill in the art may note that other appropriate types of transistors may be used without departing from the scope of the present disclosure. For example, translator 200 may include a plurality of pass transistors 208, 214 electrically coupled to a plurality of output transistors 204, 206, and electrically coupled to a plurality of keep transistors 210, 212. Although certain names have been provided in description of the various components of translator 200 in order to aid illustration, other (or no) names may be applied without departing from the scope of the present disclosure.

Throughout this disclosure, transistors may be described as having one or more current electrodes rather than specifically designating one such electrode according to the particular type of transistor involved. For example, a transistor may be described as having a "first current electrode" and a "second current electrode." Further, transistors may be described as having a "control electrode" rather than using any terminology specific to a particular type of transistor. For example, the gate of a MOSFET may be referred to as a "control electrode." Further, throughout this disclosure, connections between various parts of transistors may be referred to as being "coupled" and/or "electrically coupled" to one another. These terms may be used interchangeably.

In some embodiments, translator 200 may include a plurality of output transistors. For example, translator 200 may include transistors 204, 206. Transistors 204, 206 may be operable to provide a first output signal (e.g., $OUT_1$) dependent upon a second input signal (e.g., $IN_2$, the inverse of a first input signal $IN_1$). Transistors 204, 206 may be operable to provide a logical "high" to the first output signal (and thus the associated second higher voltage source $V_{DD2}$) when the first input signal (e.g., $IN_1$) is high, and a logical "low" to the first output signal (and thus the associated second lower voltage source $V_{SS2}$) when the first input signal is low.

In some configurations, transistor 204 may be an NFET, while transistor 206 may be a PFET. Transistors 204, 206, may be coupled to one another at one of their respective current electrodes. The other current electrodes may be coupled to different voltage sources. For example, transistor 204 may have its other current electrode coupled to a second lower voltage source (e.g., $V_{SS2}$), while transistor 206 may have its other current electrode coupled to a second higher voltage source (e.g., $V_{DD2}$). The control electrode of transistor 206 may be coupled to an input signal (e.g., $IN_2$), while the control electrode of transistor 204 may be alternatively coupled to either the same input signal (e.g., $IN_2$) or a first lower source voltage (e.g., $V_{SS1}$), depending on the state of the second output signal (e.g., $OUT_2$), as described in more detail below. For example, the control electrode of transistor 204 may be coupled to a current electrode of both transistors 208, 214, as well as a current electrode of transistor 212 at the node labeled as "$C_1$."

In some embodiments, translator 200 may include a plurality of pass transistors. For example, translator 200 may include transistors 208, 214. In some configurations, transistor 214 may be an NFET, while transistor 208 may be a PFET. Transistors 208, 214 may each have a first current electrode coupled to one another, as well as a second current electrode coupled to one another. One set of current electrode coupled to one another may occur at the node labeled as "$C_1$." Transistor 208 may have a control electrode coupled to a first low voltage source (e.g., $V_{SS1}$), while transistor 214 may have a control electrode coupled to a second output signal (e.g., $OUT_2$), as described in more detail below).

In some embodiments, translator 200 may also include a plurality of keep transistors. For example, translator 200 may include transistors 210, 212, which may both be NFETs. Transistors 210 may have one current electrode coupled to one current electrode of transistor 212, while the other current electrode may be coupled to a second lower voltage source (e.g., $V_{SS2}$). The control electrode of transistor 210 may be coupled to a first output signal (e.g., $OUT_1$). The other current electrode of transistor 212 may be coupled to transistors 204, 206, 208, 214, while the control electrode of transistor 212 may be coupled to a first input signal (e.g., $IN_1$). Transistor 210 may be operable to manage leakage current through transistor 204 in certain logical states of the input signal. Transistor 212 may be operable to manage contention over the voltage level at node $C_1$, as described in more detail below.

In prior level translators, contention has arisen at certain nodes during transition from one logical state to another logical state. That is, during transition, different transistors attempted to change a voltage level at a node in competing ways. For example, prior level translators may have only included one keep transistor, the control electrode of which may have been coupled to a first output voltage. One current electrode may have been coupled to a lower voltage source. The other current electrode may have been coupled to a control electrode of a lower output transistor and a control electrode of a pass transistor at a certain node that may be referred to here as a "first contention node." In such a configuration, however, the pass and keep transistors may have competed to change the voltage at the first contention node when the first input signal transitioned from a "high" value to a "low" value. One technique to attempt to manage this contention has been to have a pass transistor substantially larger than the keep transistor. However, for a variety of size, cost, performance, and/or process reasons, including transistors of differing sizes may be undesirable.

Another technique to manage this contention has been to include a decoupling transistor coupled to the keep transistor. For example, the keep transistor may have had a current electrode coupled to a current electrode of the decoupling transistor rather than to the first contention node. The decoupling transistor may have had its other current electrode coupled to the first contention node, and its control electrode coupled to a first input signal. However, such a configuration may have still resulted in a leakage path during certain logical states of the input signal. Further, an additional contention point may have developed at a second contention node—the node at which the output transistors are coupled to one another. In this situation. When the first input signal transitioned from a "low" value to a "high" value, the output transistors may have competed to change the voltage at the second contention node. Again, one technique to address this contention may be to make an upper output transistor substantially larger than a bottom output transistor. Again, however, transistors of different sizes may be undesirable.

Referring again to FIG. 2, translator 200 may also include transistor 214. As described in more detail above, transistor 214 may be controlled by a second output signal (e.g., $OUT_2$), which may be the logical inverse of the first output signal (e.g., $OUT_1$). Transistor 214 may be operable to manage the contention associated with a transition from a "low" to a "high" at node $C_2$. In addition, the use of the second output signal in the control of transistor 214 may be operable to manage a leakage path associated with transistor 214.

In some embodiments, the second output signal (e.g., $OUT_2$) may be provided by output circuitry 216. For example, output circuitry 216 may be an inverting circuit operable to logically invert the first input signal (e.g., $OUT_1$) provided by the level translation circuitry. In some embodiments, output circuitry 216 may be an integral part of level translator 102. In the same or alternative embodiments, output circuitry 216 may be part of second logic domain 106. For example, output circuitry 216 may be an inverter that may be one of a plurality of inverters and/or additional circuitry implementing an output buffer.

In operation, translator 200 may translate a first lower voltage level (e.g., $V_{SS1}$) to a second lower voltage level (e.g., $V_{SS2}$) (e.g., a "bottom rail translator"). Further, translator 200 may be implemented using transistors such that all transistors of a given type (e.g., all n-type transistors, all p-type transistors) are of substantially the same size. Moreover, all transistors in translator 200 may be of a minimum size as required by the manufacturing process. That is, the size of the transistors may be driven primarily by the design requirements of the manufacturing process rather than the design requirements of the circuit performance. Further, this minimum size may be scalable with the manufacturing process such that, as the transistors get smaller, so does the overall size of translator 200. Thus, even by adding transistors to translator 200, the overall size of translator 200 may be greatly reduced due to the elimination of larger transistors.

In the same or alternative embodiments, system 100 may also include translator 300 (e.g., a top rail translator), as described in more detail below with reference to FIG. 3. Depending on design configurations, translator 200 and translator 300 may be parts of the same circuit, parts of different circuits, located on the same semiconductor device, and/or located on different semiconductor devices. System 100 may include translators 200, 300 in the same implementation of translator 102, different implementations of translator 102, and/or in multiple implementations of translator 102.

Figure 3:
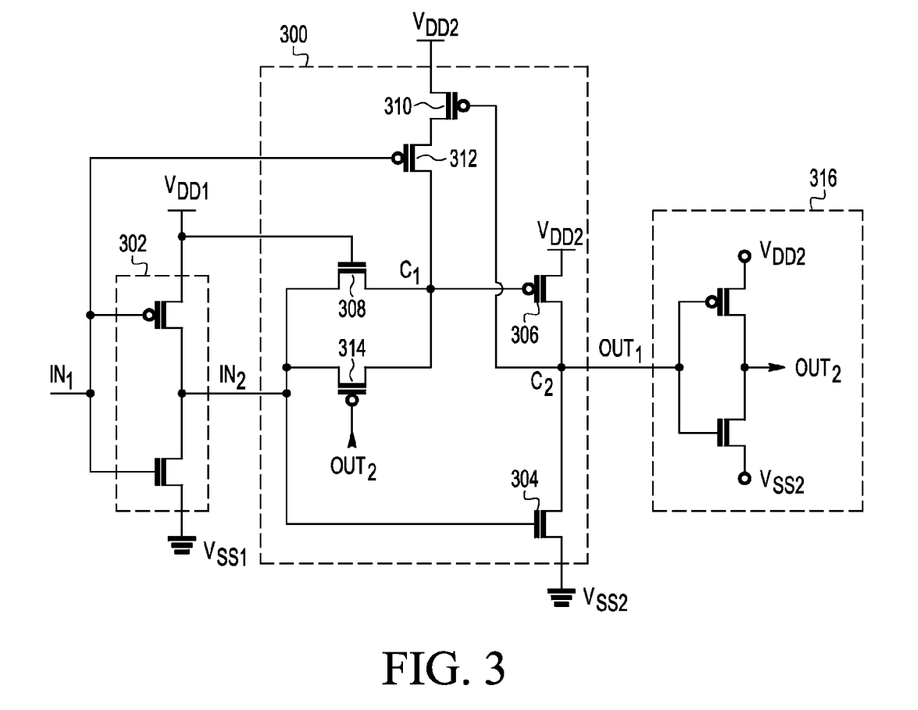
FIG. 3 illustrates an example upper voltage translator, in accordance with certain embodiments of the present disclosure.

FIG. 3 illustrates an example upper voltage translator 300, in accordance with certain embodiments of the present disclosure. Translator 300 may be electrically coupled to input circuitry 302 and output circuitry 316, and operable to translate a first upper voltage associated with input circuitry 302 (e.g., $V_{DD1}$) into a second upper voltage associated with output circuitry 316 (e.g., $V_{DD2}$). Although two lower voltages are shown (e.g., $V_{SS1}$ and $V_{SS2}$), for the purposes of translator 300, they may be considered equal. In some embodiments, input circuitry 302 may generally correspond to a portion of input logic domain 104, while output circuitry 316 may generally correspond to a portion of output logic domain 106.

In some embodiments, input circuitry 302 may be an inverting circuit providing two input signals (e.g., $IN_1$ and $IN_2$) to a level translator. These signals may be logical inverses of one another. In the illustrated example, input circuitry 302 may include an n-type transistor electrically coupled to a p-type transistor.

In some embodiments, translator 300 may include a plurality of n-type and p-type transistors. For ease of description, these transistors may be referred to as "NFETs" and "PFETs," respectively, although one of ordinary skill in the art may note that other appropriate types of transistors may be used without departing from the scope of the present disclosure. For example, translator 300 may include a plurality of pass transistors 308, 314 electrically coupled to a plurality of output transistors 304, 306, and electrically coupled to a plurality of keep transistors 310, 312. Although certain names have been provided in description of the various components of translator 300 in order to aid illustration, other (or no) names may be applied without departing from the scope of the present disclosure.

In some embodiments, translator 300 may operate in an inverted complimentary manner to translator 200 such that translator 300 may operate to translate a first upper voltage associated with input circuitry 302 to a second upper voltage associated with input circuitry 316. Translator 300 may include transistors 304, 306 coupled to one another at one of their respective current electrodes. The other current electrodes may be coupled to different voltage sources. In some configurations, transistor 304 may be an NFET, while transistor 306 may be a PFET. For example, transistor 304 may have its other current electrode coupled to a second lower voltage source (e.g., $V_{SS2}$), while transistor 306 may have its other current electrode coupled to a second higher voltage source (e.g., $V_{DD2}$). The control electrode of transistor 304 may be coupled to an input signal (e.g., $IN_2$), while the control electrode of transistor 306 may be alternatively coupled to either the same input signal (e.g., $IN_2$) or a first upper source voltage (e.g., $V_{DD1}$)) depending on the state of the second output signal (e.g., $OUT_2$), as described in more detail below. For example, the control electrode of transistor 306 may be coupled to a current electrode of both of transistors 308, 314, as well as a current electrode of transistor 312 at the node labeled as "$C_1$."

In some embodiments, translator 300 may include a plurality of pass transistors. For example, translator 300 may include transistors 308, 314. In some configurations, transistor 308 may be an NFET, while transistor 314 may be a PFET. Transistors 308, 314 may each have a first current electrode coupled to one another, as well as a second current electrode coupled to one another. One set of current electrode coupled to one another may occur at the node labeled as "$C_1$." Transistor 308 may have a control electrode coupled to a first upper voltage source (e.g., $V_{DD1}$) while transistor 314 may have a control electrode coupled to a second output signal (e.g., $OUT_2$), as described in more detail below).

In some embodiments, translator 300 may also include a plurality of keep transistors. For example, translator 300 may include transistors 310, 312, which may both be PFETs. Transistor 310 may have one current electrode coupled to one current electrode of transistor 312, while the other current electrode may be coupled to a second upper voltage source (e.g., $V_{DD2}$). The control electrode of transistor 310 may be coupled to a first output signal (e.g., $OUT_1$). The other current electrode of transistor 312 may be coupled to transistors 304, 306, 308, 314, while the control electrode of transistor 312 may be coupled to a first input signal (e.g., $IN_1$). Transistor 310 may be operable to manage leakage current through transistor 304 in certain logical states of the input signal. Transistor 312 may be operable to manage contention over the voltage level at node $C_1$.

In some embodiments, translator 300 may also include transistor 314. As described in more detail above, transistor 314 may be controlled by a second output signal (e.g., $OUT_2$), which may be the logical inverse of the first output signal (e.g., $OUT_1$). Transistor 314 may be operable to manage the contention associated with a transition from a "low" to a "high" at node $C_2$. In addition, the use of the second output signal in the control of transistor 314 may be operable to manage a leakage path associated with transistor 314.

In some embodiments, the second output signal (e.g., $OUT_2$) may be provided by output circuitry 316. For example, output circuitry 316 may be an inverting circuit operable to logically invert the first input signal (e.g., $OUT_1$) provided by the level translation circuitry. In some embodiments, output circuitry 316 may be an integral part of level translator 102. In the same or alternative embodiments, output circuitry 316 may be part of second logic domain 106. For example, output circuitry 316 may be an inverter that may be one of a plurality of inverters and/or additional circuitry implementing an output buffer.

In operation, translator 300 may translate a first upper voltage level (e.g., $V_{DD1}$) to a second upper voltage level (e.g., $V_{DD2}$) (e.g., a "top rail translator"). Further, translator 300 may be implemented using transistors such that all transistors of a given type (e.g., all n-type transistors, all p-type transistors) are of substantially the same size. Moreover, all transistors in translator 300 may be of a minimum size as required by the manufacturing process. That is, the size of the transistors may be driven primarily by the design requirements of the manufacturing process rather than the design requirements of the circuit performance. Further, this minimum size may be scalable with the manufacturing process such that, as the transistors get smaller, so does the overall size of translator 300. Thus, even by adding transistors to translator 300, the overall size of translator 300 may be greatly reduced due to the elimination of larger transistors.

In the same or alternative embodiments, system 100 may also include translator 400 (e.g., a dual rail translator), as described in more detail below with reference to FIG. 4. Depending on design configurations, translators 200, 300, 400 may be parts of the same circuit, parts of different circuits, located on the same semiconductor device, and/or located on different semiconductor devices. System 100 may include translators 200, 300, 400 in the same implementation of translator 102, different implementations of translator 102, and/or in multiple implementations of translator 102.

Figure 4:
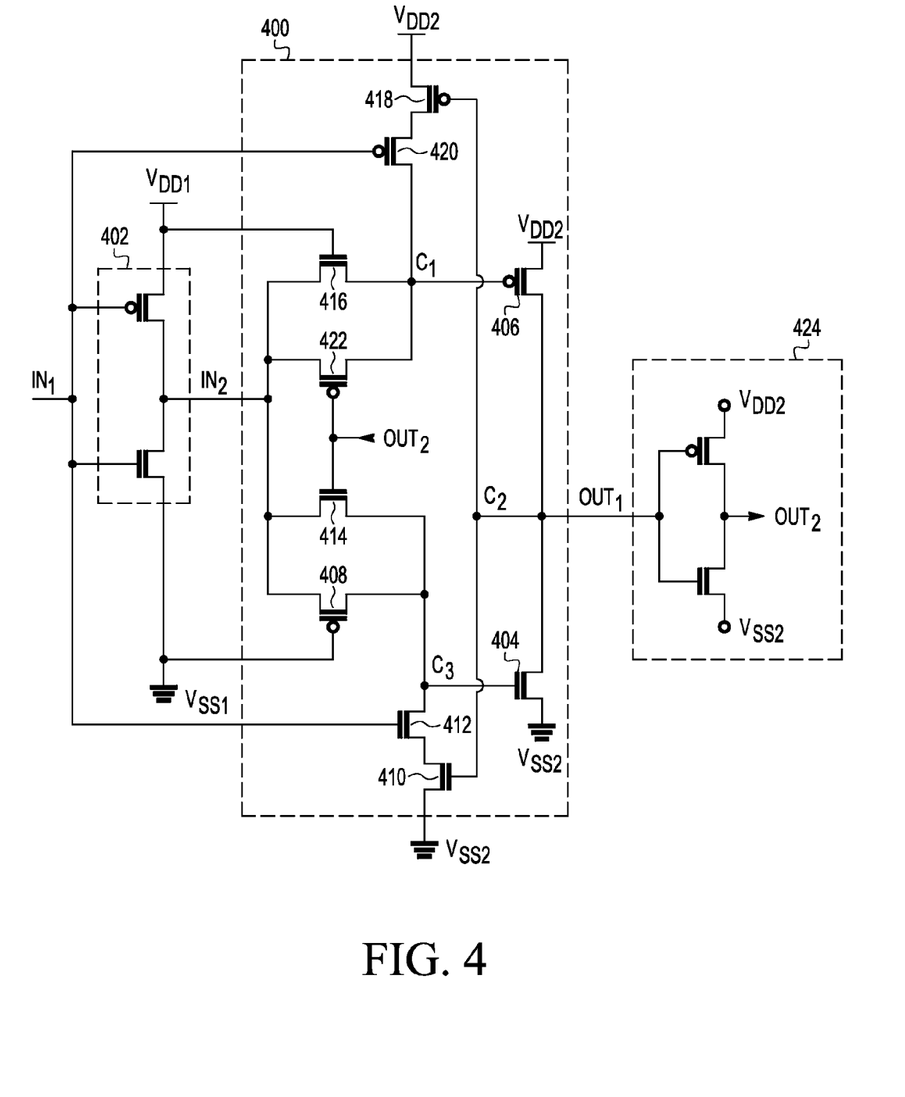
FIG. 4 illustrates an example dual voltage translator, in accordance with certain embodiments of the present disclosure.

FIG. 4 illustrates an example dual voltage translator 400, in accordance with certain embodiments of the present disclosure. Translator 400 may be electrically coupled to input circuitry 402 and output circuitry 424, and operable to translate a first lower voltage and a first upper voltage associated with input circuitry 402 (e.g., $V_{SS1}$ and $V_{DD1}$) into a second lower voltage and a second upper voltage associated with output circuitry 424, respectively (e.g., $V_{SS2}$ and $V_{DD2}$). In some embodiments, input circuitry 402 may generally correspond to a portion of input logic domain 104, while output circuitry 424 may generally correspond to a portion of output logic domain 106.

In some embodiments, input circuitry 402 may be an inverting circuit providing two input signals (e.g., $IN_1$ and $IN_2$) to a level translator. These signals may be logical inverses of one another. In the illustrated example, input circuitry 402 may include an n-type transistor electrically coupled to a p-type transistor.

In some embodiments, translator 400 may include a plurality of n-type and p-type transistors. For example, translator 400 may include a plurality of pass transistors 408, 414, 416, 422 electrically coupled to a plurality of output transistors 404, 406, and electrically coupled to a plurality of keep transistors 410, 412, 418, 420. Although certain names have been provided in description of the various components of translator 400 in order to aid illustration, other (or no) names may be applied without departing from the scope of the present disclosure.

In some embodiments, translator 400 may include a plurality of output transistors. For example, translator 400 may include transistors 404, 406. Transistors 404, 406 may be operable to provide a first output signal (e.g., $OUT_1$) dependent upon a second input signal (e.g., $IN_2$, the inverse of a first input signal $IN_1$). Transistors 404, 406 may be operable to provide a logical "high" to the first output signal (and thus the associated second higher voltage source $V_{DD2}$) when the first input signal (e.g., $IN_1$) is high, and a logical "low" to the first output signal (and thus the associated second lower voltage source $V_{SS2}$) when the first input signal is low.

In some configurations, transistor 404 may be an NFET, while transistor 406 may be a PFET. Transistors 404, 406, may be coupled to one another at one of their respective current electrodes. The other current electrodes may be coupled to different voltage sources. For example, transistor 404 may have its other current electrode coupled to a second lower voltage source (e.g., $V_{SS2}$), while transistor 406 may have its other current electrode coupled to a second higher voltage source (e.g., $V_{DD2}$). The control electrode of transistor 406 may be coupled to a current electrode of both of transistors 416, 422, as well as a current electrode of transistor 420 at the node labeled as "$C_1$." The control electrode of transistor 404 may be coupled to a current electrode of both of transistors 408, 414, as well as a current electrode of transistor 412 at the node labeled as "$C_3$."

In some embodiments, translator 400 may include a plurality of pass transistors. For example, translator 400 may include transistors 408, 414, 416, 422. In some configurations, transistors 414, 416 may be NFETs, while transistors 408, 422 may be PFETs. Transistors 416, 422 may each have a first current electrode coupled to one another, as well as a second current electrode coupled to one another. One set of current electrodes coupled to one another may occur at the node labeled as "$C_1$." Transistor 416 may have a control electrode coupled to a first upper voltage source (e.g., $V_{DD1}$), while transistor 422 may have a control electrode coupled to a second output signal (e.g., $OUT_2$). Transistors 408, 414 may each have a first current electrode coupled to one another, as well as a second current electrode coupled to one another. One set of current electrode coupled to one another may occur at the node labeled as "$C_3$." Transistor 408 may have a control electrode coupled to a first low voltage source (e.g., $V_{SS1}$), while transistor 414 may have a control electrode coupled to a second output signal (e.g., $OUT_2$).

In some embodiments, translator 400 may also include a plurality of keep transistors. For example, translator 400 may include transistors 410, 412, which may both be NFETs, as well as transistors 418, 420, which may both be PFETs. Transistor 410 may have one current electrode coupled to one current electrode of transistor 412, while the other current electrode may be coupled to a second lower voltage source (e.g., $V_{SS2}$). The control electrode of transistor 410 may be coupled to a first output signal (e.g., $OUT_1$). The other current electrode of transistor 412 may be coupled to transistors 404, 408, 414, while the control electrode of transistor 412 may be coupled to a first input signal (e.g., $IN_1$). Transistor 410 may be operable to manage leakage current through transistor 404 in certain logical states of the input signal. Transistor 412 may be operable to manage contention over the voltage level at node $C_3$.

In the same or alternative embodiments, transistor 418 may have one current electrode coupled to one current electrode of transistor 420, while the other current electrode may be coupled to a second upper voltage source (e.g., $V_{DD2}$). The control electrode of transistor 418 may be coupled to a first output signal (E.g., $OUT_1$). The other current electrode of transistor 420 may be coupled to transistor 406, 416, 422, while the control electrode of transistor 420 may be coupled to a first input signal (e.g., $IN_1$). Transistor 418 may be operable to manage leakage current through transistor 406 in certain logical states of the input signal. Transistor 420 may be operable to manage contention over the voltage level at node $C_1$.

Translator 400 may also include transistors 414, 422. As described in more detail above, transistors 414, 422 may be controlled by a second output signal (e.g., $OUT_2$), which may be the logical inverse of the first output signal (e.g., $OUT_1$). Transistors 414, 422 may be operable to manage the contention associated with a transition from a "low" to a "high" at node $C_2$. In addition, the use of the second output signal in the control of transistors 414, 422 may be operable to manage a leakage path associated with transistors 414, 422.

In some embodiments, the second output signal (e.g., $OUT_2$) may be provided by output circuitry 424. For example, output circuitry 424 may be an inverting circuit operable to logically invert the first input signal (e.g., $OUT_1$) provided by the level translation circuitry. In some embodiments, output circuitry 424 may be an integral part of level translator 102. In the same or alternative embodiments, output circuitry 424 may be part of second logic domain 106. For example, output circuitry 424 may be an inverter that may be one of a plurality of inverters and/or additional circuitry implementing an output buffer.

In operation, translator 400 may translate both a first lower voltage level (e.g., $V_{SS1}$) to a second lower voltage level (e.g., $V_{SS2}$) and a first upper voltage level (e.g., $V_{DD1}$) to a second upper voltage level (e.g., $V_{DD2}$) (e.g., a "dual rail translator"). Further, translator 400 may be implemented using transistors such that all transistors of a given type (e.g., all n-type transistors, all p-type transistors) are of substantially the same size. Moreover, all transistors in translator 400 may be of a minimum size as required by the manufacturing process. That is, the size of the transistors may be driven primarily by the design requirements of the manufacturing process rather than the design requirements of the circuit performance. Further, this minimum size may be scalable with the manufacturing process such that, as the transistors get smaller, so does the overall size of translator 400. Thus, even by adding transistors to translator 400, the overall size of translator 400 may be greatly reduced due to the elimination of larger transistors.

By now it should be appreciated that there has been provided a ratioless, near-threshold level translator that may be implemented to translate one or more levels using transistors of the same or substantially the same size, allowing for a greater degree of scalability of the level translation circuitry.

The level translator may include circuitry including an output circuit (202, 302) coupled between a first power supply terminal and a second power supply terminal that receives ($IN_1$) a first logic signal that switches between a first logic state based on a voltage at the first power supply terminal ($V_{DD1}$) and a second logic state based on a voltage at the second power supply terminal ($V_{SS1}$) and provides a second logic signal ($IN_2$), complementary to the first logic signal, that switches between a first logic state based on a voltage at the first power supply terminal and a second logic state based on a voltage at the second power supply terminal. The circuitry may also include a level translator that includes a first transistor (214, 314) of a first type having a first current electrode for receiving the first logic signal, a second current electrode, and a control electrode; a first transistor (208, 308) of a second type having a first current electrode for receiving the first logic signal, a second current electrode coupled to the second current electrode of the first transistor of the first type, and a control electrode coupled to the second power supply terminal; a second transistor (206, 304) of the second conductivity type having a control electrode that receives the first input signal, a first current electrode coupled to a third power supply terminal ($V_{DD2}$, $V_{SS2}$), and a second current electrode as a first output; a second transistor (212, 312) of the first conductivity type having a first current electrode coupled to the second current electrode of the first transistor of the second conductivity type, a control electrode for receiving the first logic signal, and a second current electrode; a third transistor (210, 310) of the first conductivity type having a first current electrode coupled to the second current electrode of the second transistor of the first conductivity type, a second current electrode coupled to a fourth power supply terminal ($V_{SS2}$, $V_{DD2}$); and a control electrode coupled to the second current electrode of the second transistor of the second conductivity type; a fourth transistor (204, 306) of the first conductivity type having a control electrode coupled to the second current electrode of the first transistor of the second conductivity type, a first current electrode coupled to the second current electrode of the second transistor of the second conductivity type, and a second current electrode coupled to the fourth power supply terminal; and an inverting circuit (216, 316) coupled to the third and fourth power supply terminals having an input coupled to the second current electrode of the second transistor of the second conductivity type and an output coupled to the control electrode of the first transistor of the first conductivity type.

In some embodiments, this circuit may be implemented such that the first, second, third, and fourth transistors of the first conductivity type have the same channel length and channel width. The first and second transistors of the second conductivity type may also have the same channel length and channel width.

In the same or alternative embodiments, this circuit may be implemented such that the circuit has a minimum channel length and minimum channel width for transistors and the first, second, third, and fourth transistors of the first conductivity type have the minimum channel length and channel width. The first and second transistors of the second conductivity type may also have the minimum channel length and channel width.

In some embodiments, the first conductivity type may be N channel and the second conductivity type may be P channel. In such a configuration, the first and third power supply terminals may be configured to receive a first voltage at a first level, the second power supply terminal may be configured to receive a second voltage that is negative with respect to the first voltage, and the fourth power supply terminal may be configured to receive a third voltage that is more negative than the second voltage with respect to the first voltage.

In the same or alternative embodiments, the second conductivity type may be N channel and the first conductivity type may be P channel. In such a configuration, the first and third power supply terminals may be configured to receive a first voltage at a first level, the second power supply terminal may be configured to receive a second voltage that is positive with respect to the first voltage, and the fourth power supply terminal may be configured to receive a third voltage that is more positive than the second voltage with respect to the first voltage.

In some embodiments, the level translator may further include a fifth transistor (416) of the first conductivity type having a first current electrode that receives the second logic signal, a control electrode coupled to the first power supply terminal, and a second current electrode coupled to the control electrode of the second transistor of the second conductivity type; a third transistor (422) of the second conductivity type having a first current electrode that receives the second logic signal, a control electrode coupled to the output of the inverting circuit, and a second current electrode coupled to the control electrode of the second transistor of the second conductivity type; a fourth transistor (420) of the second conductivity type having a first current electrode coupled to the second current electrode of the third transistor of the second conductivity type, a control electrode that receives the second logic signal, and a second current electrode; and a fifth transistor (418) of the first conductivity type having a first current electrode coupled to the second current electrode of the fourth transistor of the second conductivity type, a second current electrode coupled to the third power supply terminal ($V_{DD2}$); and a control electrode coupled to the second current electrode of the second transistor of the second conductivity type.

The circuit described above may be implemented such that the first, second, third, fourth, and fifth transistors may be of the first conductivity type and the first, second, third, fourth, and fifth transistors may be of the second conductivity type have the same channel length and channel width. Further, the first, second, third, fourth, and fifth transistors may be of the first conductivity type and the first, second, third, fourth, and fifth transistors may be of the second conductivity type have the same channel length and channel width.

In some embodiments, the first conductivity type may be N channel, the second conductivity type may be P channel, the first power supply terminal may be configured to receive a first voltage at a first level, the second power supply terminal may be configured to receive a second voltage that is negative with respect to the first voltage, the third power supply terminal may be configured to receive a third voltage that is positive relative to the first voltage, and the fourth power supply terminal may be configured to receive a fourth voltage that is negative relative to the second voltage.

In the same or alternative embodiments, the first conductivity type may be P channel, the second conductivity type may be N channel, the first power supply terminal may be configured to receive a first voltage at a first level, the second power supply terminal may be configured to receive a second voltage that is positive with respect to the first voltage, the third power supply terminal may be configured to receive a third voltage that is negative relative to the first voltage, and the fourth power supply terminal may be configured to receive a fourth voltage that is positive relative to the second voltage.

In some embodiments, the inverting circuit (424) may include a sixth transistor of the first conductivity type having a first current electrode coupled to the fourth power supply terminal, a control electrode coupled to the second current electrode of the fourth transistor of the first conductivity type, and a second current electrode coupled to the control electrode of the first transistor of the first conductivity type; and a sixth transistor of the second conductivity type having a first current electrode coupled to the third power supply terminal, a control electrode coupled to the second current electrode of the fourth transistor of the first conductivity type, and a second current electrode coupled to the control electrode of the third transistor of the second conductivity type.

In some embodiments, the circuitry may include an output circuit (202, 302) in a first power supply domain configured to have a first voltage differential between a first power supply terminal and a second power supply terminal, wherein the output circuit receives a first logic signal ($IN_1$) that switches between a first logic state based on a voltage at the first power supply terminal ($V_{DD1}$) and a second logic state based on a voltage at the second power supply terminal ($V_{SS1}$) and provides a second logic signal ($IN_2$), complementary to the first logic signal, that switches between a first logic state based on a voltage at the first power supply terminal and a second logic state based on a voltage at the second power supply terminal; and a level translator in a second power supply domain configured to have a second voltage differential between a third power supply terminal and a fourth power supply terminal, wherein the second voltage differential is greater than the first voltage differential.

The level translator may include a first transistor (214, 314) of a first type having a first current electrode for receiving the first logic signal, a second current electrode, and a control electrode; a first transistor (208, 308) of a second type having a first current electrode for receiving the first logic signal, a second current electrode coupled to the second current electrode of the first transistor of the first type, and a control electrode coupled to the second power supply terminal; a second transistor (206, 304) of the second conductivity type having a gate that receives the first input signal, a source coupled to a third power supply terminal ($V_{DD2}$, $V_{SS2}$) and a drain as a first output terminal of the level translator; a second transistor (212, 312) of the first conductivity type having a drain coupled to the second current electrode of the first transistor of the second conductivity type, a gate configured to receive the first logic signal, and a source; a third transistor (210, 310) of the first conductivity type having a drain coupled to the source of the second transistor of the first conductivity type, a source coupled to a fourth power supply terminal ($V_{SS2}$) $V_{DD2}$); and a gate coupled to the first output terminal; a fourth transistor (204, 306) of the first conductivity type having a gate coupled to the second current electrode of the first transistor of the second conductivity type, a drain coupled to the first output terminal, and a source coupled to the fourth power supply terminal; and an inverting circuit (216, 316) coupled to the third and fourth power supply terminals having an input coupled to the first output terminal and an output coupled to the control electrode of the first transistor of the first conductivity type.

In such circuitry, the first, second, third, and fourth transistors of the first conductivity type may have the same channel length and channel width. Further, the circuit may have a minimum channel length and minimum channel width for transistors and the first, second, third, and fourth transistors of the first conductivity type may have the minimum channel length and channel width.

In such circuitry, the level translator may further include a fifth transistor (416) of the first conductivity type having a first current electrode that receives the second logic signal, a control electrode coupled to the first power supply terminal, and a second current electrode coupled to the gate of the second transistor of the second conductivity type; a third transistor (422) of the second conductivity type having a first current electrode that receives the second logic signal, a control electrode coupled to the output of the inverting circuit, and a second current electrode coupled to the gate of the second transistor of the second conductivity type; a fourth transistor (420) of the second conductivity type having a drain coupled to the second current electrode of the third transistor of the second conductivity type, a gate configured to receive the second logic signal, and a source; and a fifth transistor (418) of the second conductivity type having a drain coupled to the source of the fourth transistor of the second conductivity type, a source coupled to the third power supply terminal ($V_{DD2}$); and a gate coupled to the first output.

In some embodiments, circuitry may be designed using transistors, wherein a subset of the transistors have the shortest channel length and narrowest channel width. The circuitry may include an output circuit (202, 302) in a first power supply domain configured to have a first voltage differential between a first power supply terminal and a second power supply terminal, wherein the output circuit receives a first logic signal ($IN_1$) that switches between a first logic state based on a voltage at the first power supply terminal ($V_{DD1}$) and a second logic state based on a voltage at the second power supply terminal ($V_{SS1}$) and provides a second logic signal ($IN_2$), complementary to the first logic signal, that switches between a first logic state based on a voltage at the first power supply terminal and a second logic state based on a voltage at the second power supply terminal; and a level translator having in a second power supply domain configured to have a second voltage differential between a third power supply terminal and a fourth power supply terminal, wherein the second voltage differential is greater than the first voltage differential.

The level translator may include from the subset, a first transistor (214, 314) of a first type having a first current electrode for receiving the first logic signal, a second current electrode, and a control electrode; from the subset, a first transistor (208, 308) of a second type having a first current electrode for receiving the first logic signal, a second current electrode coupled to the second current electrode of the first transistor of the first type, and a control electrode coupled to the second power supply terminal; from the subset, a second transistor (206, 304) of the second conductivity type having a gate that receives the first input signal, a source coupled to a third power supply terminal ($V_{DD2}$, $V_{SS2}$), and a drain as a first output terminal of the level translator; from the subset, a second transistor (212, 312) of the first conductivity type having a drain coupled to the second current electrode of the first transistor of the second conductivity type, a gate configured to receive the first logic signal, and a source; from the subset, a third transistor (210, 310) of the first conductivity type having a drain coupled to the source of the second transistor of the first conductivity type, a source coupled to a fourth power supply terminal ($V_{SS2}$, $V_{DD2}$); and a gate coupled to the first output terminal; from the subset, a fourth transistor (204, 306) of the first conductivity type having a gate coupled to the second current electrode of the first transistor of the second conductivity type, a drain coupled to the first output terminal, and a source coupled to the fourth power supply terminal; and an inverting circuit (216, 316) coupled to the third and fourth power supply terminals having an input coupled to the first output terminal and an output coupled to the control electrode of the first transistor of the first conductivity type, wherein the inverting circuit comprises transistors from the subset.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

What is claimed is:

1. A circuit, comprising:
    an output circuit (202, 302, 402) coupled between a first power supply terminal and a second power supply terminal that receives (IN1) a first logic signal that switches between a first logic state based on a voltage at the first power supply terminal (VDD1) and a second logic state based on a voltage at the second power supply terminal (VSS1) and provides a second logic signal (IN2), complementary to the first logic signal, that switches between a first logic state based on a voltage at the first power supply terminal and a second logic state based on a voltage at the second power supply terminal; and
    a level translator, comprising:
        a first transistor (214, 314, 416) of a first conductivity type having a first current electrode for receiving the first logic signal, a second current electrode, and a control electrode;
        a first transistor (208, 308, 422) of a second type having a first current electrode for receiving the first logic signal, a second current electrode coupled to the second current electrode of the first transistor of the first type, and a control electrode coupled to the second power supply terminal;
        a second transistor (206, 304, 406) of the second conductivity type having a control electrode that receives the first input signal, a first current electrode coupled to a third power supply terminal (VDD2, VSS2), and a second current electrode as a first output;
        a second transistor (212, 312, 412) of the first conductivity type having a control electrode for receiving the first logic signal;
        a third transistor (210, 310, 410) of the first conductivity type having a control electrode coupled to the second current electrode of the second transistor of the second conductivity type, wherein first and second current electrodes of the second and third transistors of the first conductivity type are coupled in series between a fourth power supply terminal and the second current electrode of the first transistor of the second conductivity type;
        a fourth transistor (204, 306, 404) of the first conductivity type having a control electrode coupled to the second current electrode of the first transistor of the second conductivity type, a first current electrode coupled to the second current electrode of the second transistor of the second conductivity type, and a second current electrode coupled to the fourth power supply terminal; and
        an inverting circuit (216, 316, 416) coupled to the third and fourth power supply terminals having an input coupled to the second current electrode of the second transistor of the second conductivity type and an output coupled to the control electrode of the first transistor of the first conductivity type.

2. The circuit of claim 1, wherein the first, second, third, and fourth transistors of the first conductivity type have the same channel length and channel width.

3. The circuit of claim 2, wherein the first and second transistors of the second conductivity type have the same channel length and channel width.

4. The circuit of claim 1, wherein the circuit has a minimum channel length and minimum channel width for transistors and the first, second, third, and fourth transistors of the first conductivity type have the minimum channel length and channel width.

5. The circuit of claim 4, wherein the first and second transistors of the second conductivity type have the minimum channel length and channel width.

6. The circuit of claim 1, wherein the first conductivity type is N channel and the second conductivity type is P channel.

7. The circuit of claim 6, wherein the first and third power supply terminals are configured to receive a first voltage at a first level, the second power supply terminal is configured to receive a second voltage that is negative with respect to the first voltage, and the fourth power supply terminal is configured to receive a third voltage that is more negative than the second voltage with respect to the first voltage.

8. The circuit of claim 1, wherein the second conductivity type is N channel and the first conductivity type is P channel.

9. The circuit of claim 8, wherein the first and third power supply terminals are configured to receive a first voltage at a first level, the second power supply terminal is configured to receive a second voltage that is positive with respect to the first voltage, and the fourth power supply terminal is configured to receive a third voltage that is more positive than the second voltage with respect to the first voltage.

10. The circuit of claim 1, wherein the level translator further comprises;
a fifth transistor (416) of the first conductivity type, interposed between the control electrode of the second transistor of the second conductivity type and the second logic signal, having a first current electrode that receives the second logic signal (IN2), a control electrode coupled to the first power supply terminal (VDD1), and a second current electrode coupled to the control electrode of the second transistor of the second conductivity type;
a third transistor (422) of the second conductivity type, interposed between the control electrode of the second transistor of the second conductivity type and the second logic signal, having a first current electrode that receives the second logic signal, a control electrode coupled to the output of the inverting circuit, and a second current electrode coupled to the control electrode of the second transistor of the second conductivity type;
a fourth transistor (420) of the second conductivity type having a control electrode that receives the first logic signal; and
a fifth transistor (418) of the second conductivity type having a control electrode coupled to the second current electrode of the second transistor of the second conductivity type, wherein first and second current electrodes of the fourth and fifth transistors of the second conductivity type are coupled in series between the third power supply terminal and the second current electrode of the third transistor of the second conductivity type.

11. The circuit of claim 10, wherein:
the first, second, third, fourth, and fifth transistors of the first conductivity type and the first, second, third, fourth, and fifth transistors of the second conductivity type have the same channel length and channel width.

12. The circuit of claim 10, wherein:
the first, second, third, fourth, and fifth transistors of the first conductivity type and the first, second, third, fourth, and fifth transistors of the second conductivity type have the same channel length and channel width.

13. The circuit of claim 10, wherein the first conductivity type is N channel, the second conductivity type is P channel, the first power supply terminal is configured to receive a first voltage at a first level, the second power supply terminal is configured to receive a second voltage that is negative with respect to the first voltage, the third power supply terminal is configured to receive a third voltage that is positive relative to the first voltage, and the fourth power supply terminal is configured to receive a fourth voltage that is negative relative to the second voltage.

14. The circuit of claim 10, wherein the first conductivity type is P channel, the second conductivity type is N channel, the first power supply terminal is configured to receive a first voltage at a first level, the second power supply terminal is configured to receive a second voltage that is positive with respect to the first voltage, the third power supply terminal is configured to receive a third voltage that is negative relative to the first voltage, and the fourth power supply terminal is configured to receive a fourth voltage that is positive relative to the second voltage.

15. The circuit of claim 10, wherein the inverting circuit comprises:
a sixth transistor of the first conductivity type having a first current electrode coupled to the fourth power supply terminal, a control electrode coupled to the second current electrode of the fourth transistor of the first conductivity type, and a second current electrode coupled to the control electrode of the first transistor of the first conductivity type; and
a sixth transistor of the second conductivity type having a first current electrode coupled to the third power supply terminal, a control electrode coupled to the second current electrode of the fourth transistor of the first conductivity type, and a second current electrode coupled to the control electrode of the third transistor of the second conductivity type.

16. A circuit, comprising:
an output circuit (202, 302) in a first power supply domain configured to have a first voltage differential between a first power supply terminal and a second power supply terminal, wherein the output circuit receives a first logic signal (IN1) that switches between a first logic state based on a voltage at the first power supply terminal (VDD1) and a second logic state based on a voltage at the second power supply terminal (VSS1) and provides a second logic signal (IN2), complementary to the first logic signal, that switches between a first logic state based on a voltage at the first power supply terminal and a second logic state based on a voltage at the second power supply terminal; and
a level translator in a second power supply domain configured to have a second voltage differential between a third power supply terminal and a fourth power supply terminal, wherein the second voltage differential is greater than the first voltage differential, comprising:

a first transistor (214, 314) of a first type having a first current electrode for receiving the first logic signal, a second current electrode, and a control electrode;

a first transistor (208, 308) of a second type having a first current electrode for receiving the first logic signal, a second current electrode coupled to the second current electrode of the first transistor of the first type, and a control electrode coupled to the second power supply terminal;

a second transistor (206, 304) of the second conductivity type having a gate that receives the first input signal, a source coupled to a third power supply terminal (VDD2, VSS2), and a drain as a first output terminal of the level translator;

a second transistor (212, 312) of the first conductivity type having a drain coupled to the second current electrode of the first transistor of the second conductivity type, a gate configured to receive the first logic signal, and a source;

a third transistor (210, 310) of the first conductivity type having a drain coupled to the source of the second transistor of the first conductivity type, a source coupled to a fourth power supply terminal (VSS2, VDD2); and a gate coupled to the first output terminal;

a fourth transistor (204, 306) of the first conductivity type having a gate coupled to the second current electrode of the first transistor of the second conductivity type, a drain coupled to the first output terminal, and a source coupled to the fourth power supply terminal; and an inverting circuit (216, 316) coupled to the third and fourth power supply terminals having an input coupled to the first output terminal and an output coupled to the control electrode of the first transistor of the first conductivity type.

17. The circuit of claim 16, wherein the first, second, third, and fourth transistors of the first conductivity type have the same channel length and channel width.

18. The circuit of claim 16, wherein the circuit has a minimum channel length and minimum channel width for transistors and the first, second, third, and fourth transistors of the first conductivity type have the minimum channel length and channel width.

19. The circuit of claim 16, wherein the level translator further comprises;

a fifth transistor (416) of the first conductivity type having a first current electrode that receives the second logic signal, a control electrode coupled to the first power supply terminal, and a second current electrode coupled to the gate of the second transistor of the second conductivity type;

a third transistor (422) of the second conductivity type having a first current electrode that receives the second logic signal, a control electrode coupled to the output of the inverting circuit, and a second current electrode coupled to the gate of the second transistor of the second conductivity type;

a fourth transistor (420) of the second conductivity type having a drain coupled to the second current electrode of the third transistor of the second conductivity type, a gate configured to receive the second logic signal, and a source; and a fifth transistor (418) of the second conductivity type having a drain coupled to the source of the fourth transistor of the second conductivity type, a source coupled to the third power supply terminal (VDD2); and a gate coupled to the first output.

20. A circuit designed using transistors, wherein a subset of the transistors have the shortest channel length and narrowest channel width, comprising:

an output circuit (202, 302) in a first power supply domain configured to have a first voltage differential between a first power supply terminal and a second power supply terminal, wherein the output circuit receives a first logic signal (IN1) that switches between a first logic state based on a voltage at the first power supply terminal (VDD1) and a second logic state based on a voltage at the second power supply terminal (VSS1) and provides a second logic signal (IN2), complementary to the first logic signal, that switches between a first logic state based on a voltage at the first power supply terminal and a second logic state based on a voltage at the second power supply terminal; and a level translator having in a second power supply domain configured to have a second voltage differential between a third power supply terminal and a fourth power supply terminal, wherein the second voltage differential is greater than the first voltage differential, comprising:

from the subset, a first transistor (214, 314) of a first type having a first current electrode for receiving the first logic signal, a second current electrode, and a control electrode;

from the subset, a first transistor (208, 308) of a second type having a first current electrode for receiving the first logic signal, a second current electrode coupled to the second current electrode of the first transistor of the first type, and a control electrode coupled to the second power supply terminal;

from the subset, a second transistor (206, 304) of the second conductivity type having a gate that receives the first input signal, a source coupled to a third power supply terminal (VDD2, VSS2), and a drain as a first output terminal of the level translator;

from the subset, a second transistor (212, 312) of the first conductivity type having a drain coupled to the second current electrode of the first transistor of the second conductivity type, a gate configured to receive the first logic signal, and a source;

from the subset, a third transistor (210, 310) of the first conductivity type having a drain coupled to the source of the second transistor of the first conductivity type, a source coupled to a fourth power supply terminal (VSS2, VDD2); and a gate coupled to the first output terminal;

from the subset, a fourth transistor (204, 306) of the first conductivity type having a gate coupled to the second current electrode of the first transistor of the second conductivity type, a drain coupled to the first output terminal, and a source coupled to the fourth power supply terminal; and an inverting circuit (216, 316) coupled to the third and fourth power supply terminals having an input coupled to the first output terminal and an output coupled to the control electrode of the first transistor of the first conductivity type, wherein the inverting circuit comprises transistors from the subset.

\* \* \* \* \*